United States Patent [19]

Beermann

[11] 4,020,764
[45] May 3, 1977

[54] DETONATOR

[75] Inventor: Paul Beermann, Lendringsen, Germany

[73] Assignee: Hagenuk & Co. GmbH, Menden, Germany

[22] Filed: Feb. 25, 1975

[21] Appl. No.: 552,784

[30] Foreign Application Priority Data

Feb. 26, 1974 Germany .................. 7406695[U]

[52] U.S. Cl. .................. 102/70 S; 102/8; 102/81.6
[51] Int. Cl.² .................. F42C 15/00
[58] Field of Search .......... 102/70 R, 70 S, 8, 16, 102/81.6, 64, 73 A; 89/1 B

[56] References Cited
UNITED STATES PATENTS

| 2,935,949 | 5/1960 | Holford | 102/70 R |
| 3,119,334 | 1/1964 | Beermann | 102/81.6 |
| 3,831,521 | 8/1974 | Engeli | 102/70 R X |
| 3,901,155 | 8/1975 | Huber | 102/70 R |

FOREIGN PATENTS OR APPLICATIONS

| 297,057 | 3/1954 | Switzerland | 102/8 |
| 693,479 | 7/1953 | United Kingdom | 102/8 |

Primary Examiner—David H. Brown
Attorney, Agent, or Firm—Michael J. Striker

[57] ABSTRACT

A detonator which is protected against triggering by shock waves or the like has a housing, a firing cap in the housing and a firing pin movable lengthwise in the housing and having a free end adapted to impact the firing cap. A biasing spring permanently biases the firing pin towards the firing cap, and a firing-pin retainer is provided in form of a spring-wire clip having a circumferentially incomplete retaining portion located in the housing and received in an annular channel composed of two registering annular grooves formed in an outer circumferential surface of the firing pin and a juxtaposed inner circumferential surface of the housing.

10 Claims, 4 Drawing Figures

FIG. 1
FIG. 2
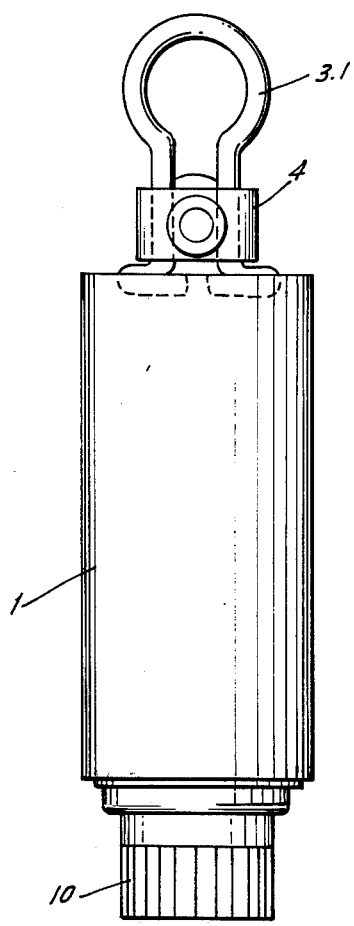
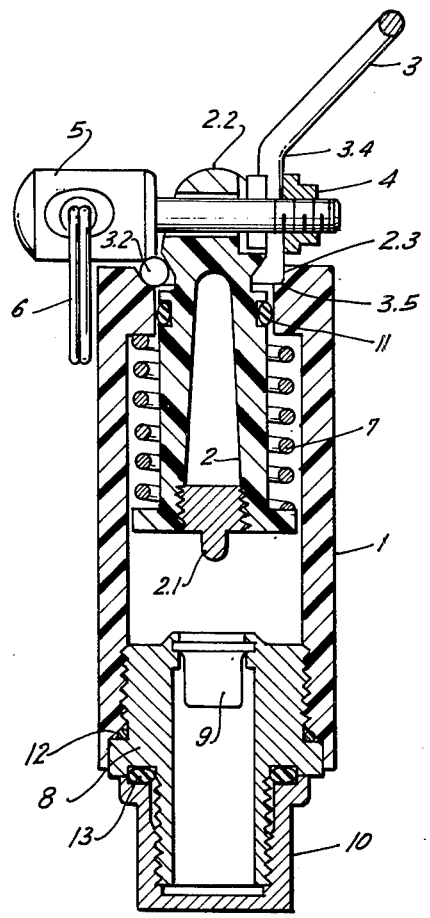
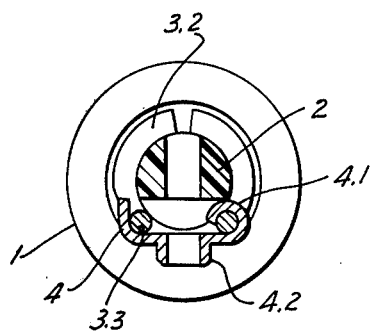
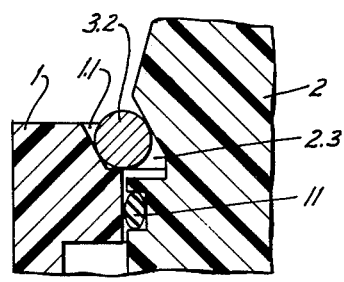
FIG. 3
FIG. 4

DETONATOR

BACKGROUND OF THE INVENTION

The present invention relates to a detonator in general, and more particularly to a detonator which is protected against undesired triggering as a result of shock waves or the like.

Detonators of this type are used primarily in military applications, for example in land mines. It is known from the prior art to provide such a detonator in which a housing accommodates a firing cap and a firing pin which is urged towards the firing cap, to impact the same, by a biasing spring. A wire retaining ring of spring wire is formed to a configuration resembling three laterally adjacent rings of which the center one is approximately half as large as the two outer ones and is lodged in a conical circumferential groove formed in the exterior surface of the firing pin. The ends of the wire which is formed to this configuration are soldered together. The conical configuration of the groove tends to act like a wedge upon the center ring portion and tends to expand the same. This retaining ring, or rather retaining clip, is in flat engagement with an end of the housing and constitutes the sole means of holding the firing pin after the safety pin of the detonator has been removed. This means that once the safety pin has been removed, the only thing that keeps the firing pin from impacting the firing cap is the spring tension of the retaining clip. This is a highly dangerous construction since the resilience of the spring wire of the retaining clip deteriorates over a period of time so that the biasing action of the firing-pin biasing spring is capable of pulling the firing pin out of the center ring of the retaining clip and detonating the device. In fact, the soldering-together of the free ends of the wire to form it to the desired retaining-clip configuration and the heat which is transmitted to the wire during that operation, itself tends to counteract the springiness of the wire. Moreover, the solder joint itself tends over a period of time to become brittle and can break under the stress exerted upon it by the tendency of the two ends of the wire of the retaining clip to move apart, especially under the wedging action exerted upon them by the spring-biased firing pin. If for any of these reasons the detonator operates accidentally, this represents an exceedingly high degree of danger for human life, especially as this type of detonator is primarily used in land mines, and even more particularly in anti-personnel mines of the "bounce" type which, when detonated, are "bounced" into the air by the explosion of a small charge whereupon the major charge is triggered in order to do as much damage to personnel as possible by the mine splinters and/or shrapnel. As example of this type of mine is the "Claymore" mine.

Aside from this danger of undesired operation, the prior-art detonator has a further disadvantage, namely its susceptibility to triggering by enemy action. It is conventional practice to attempt to disrupt a mine field by bringing it under cannon fire to detonate the mines, or else by shooting special mine-clearing devices, such as rope-ladders or the like which carry explosives, into the air over the mine field so that they drop onto the mine field and detonate their explosives with the purpose of in turn detonating the mines. Under either of these circumstances the detonators of the mines in a mine field are subjected to very high pressure bursts, possibly even atomic bursts, which either lead to an immediate detonation of the prior-art detonator due to high shock wave pressures acting upon the firing pin and capable of pushing it through and out of the retaining clip, or at the very least lead to dangerous deformations or shifting of the retaining clip.

Evidently, premature detonation of the mines in a mine field by one of the aforementioned approaches is undesired since it defeats the blocking action which is the main purpose of a mine field. On the other hand, deformations of the retaining clip are undesirable because they make the detonator highly unstable and deny the defender the latter possibility of clearing the mine field by conventional mineclearing equipment, i.e. without having to explode the mines. This causes new dangers and high expenses.

SUMMARY OF THE INVENTION

Accordingly, it is a general object of this invention to overcome the disadvantages of the prior art.

More particularly, it is an object of the invention to provide an improved detonator which is not possessed of the aforementioned disadvantages.

Still more particularly, it is an object of this present invention to provide an improved detonator which is light in weight, watertight and corrosion-resistant, and which cannot be triggered even by strong shock waves, including those originating upon the detonation of atomic weapons, and which also cannot accidentally operate.

A further object of the invention is to provide such a detonator which is economical to manufacture and which can be reliably used with all types of explosive devices and under all ambient conditions.

In keeping with these objects, and others which will become apparent hereafter, one feature of the invention resides in a detonator which, briefly stated, comprises a housing, a firing cap in the housing, and a firing pin movable lenghtwise in the housing and having a free end adapted to impact the firing cap. Biasing means permanently biases the firing pin towards the firing cap. Firing-pin retaining means is provided for retaining the firing pin against yielding to the biasing force of the biasing means, comprising a spring-wire clip having a circumferentially incomplete retaining portion received in an annular channel composed of two registering annular grooves formed in an outer circumferential surface of the firing pin and a juxtaposed inner circumferential surface of the housing.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

FIG. 1 is a side view showing an embodiment of the invention;

FIG. 2 is a longitudinal section through the detonator shown in FIG. 1;

FIG. 3 is a top-plan view of the detonator in FIGS. 1 and 2, partly in section and with certain portions removed for the sake of clarity; and FIG. 4 is a sectioned detail view of the embodiment in FIGS. 1–3.

DESCRIPTION OF THE PREFERRED EMBODIMENTS

Referring now to the drawing in detail, which shows in FIGS. 1-4 a single exemplary embodiment of the invention, it will be seen that reference numeral 1 identifies the housing of the detonator which is preferably but not necessarily made of an impact- and temperature-resistant synthetic plastic material, for example of the type available under the trade name "Makrolon" or the type available under the trade name "Lexan". At the bottom end of the housing a nipple 8 is threaded into the housing 1; it consists preferably of rust-free steel or brass in order to have a high structural strength. The firing cap 9 is arranged in the nipple 8, and a cap 10, in conjunction with an O-ring 13, prevents entry of moisture. A further O-ring 12 is provided which cooperates with the nipple 8 and the housing 1 and also serves a sealing purpose.

The housing 1 is provided with an interior passage in which a firing pin 2 can move axially. In the illustrated embodiment the firing pin is hollow, although it could also be of solid cross section. The firing pin is preferably also of a temperature-resistant and impact-resistant synthetic plastic material, for example one of the two types mentioned before. Its free end has threaded into it a portion 2.1 which is of metallic material and which, when the firing pin 2 is snapped towards the firing cap 9, will engage and detonate the firing cap. Thus, only a small amount of metal is required for the firing pin, namely the portion 2.1 which saves metal and makes the firing pin less expensive. The portion 2.2 of the firing pin projects from the other end of the housing 1 where it is retained by the retaining bracket 3 which is of spring wire and which has a circumferentially incomplete ring portion 3.2 that is so bent that when installed it will extend substantially normal to the elongation of the housing 1, and thus be located in a plane which extend substantially normal to the plane in which the outer engaging portion 3.1 is located. The inwardly facing circumferential surface of the housing 1 is formed with an annular groove 1.1 and the outer circumferential surface of the firing pin 2 is formed with a similar annular groove 2.3; these grooves are located opposite one another and form with one another an annular channel in which the ring portion 3.2 is located. The groove 2.3 in the firing pin 2 has in direction normal to the elongation of the firing pin a depth which is at least equal to half the diameter of the wire of the ring portion 3.2. The material of the bracket 3 should be a rust-free material, preferably (but not exclusively) phosphor bronze. A biasing spring 7 is provided, also composed of a rust-free material, such as steel, and acts upon the firing pin 2 in a sense tending to snap the same against the firing cap 9 when the firing pin 2 is released. An O-ring 11 is provided which provides a watertight seal between the housing 1 and the firing pin 2.

Reference numeral 5 identifies a safety pin which is also of a rust-free material, for example steel or the like, and which is provided with an engaging ring 6. It is threaded into a retaining nut 4 which is also of rust-free material; the safety pin 5 will of course be removed when the detonator is made ready for use, for example when a mine provided with the detonator is installed as part of the mine field. At that time it will only be the bracket 3 which holds the firing pin 2 in place.

As FIG. 4 shows, the cross-sectional configuration of the groove 1.1 is preferably conical or near-conical, as is the groove 2.3. The ring portion 3.2 is lodged partially in the groove 1.1 and partially in the groove 2.3, so that the firing pin 2 is retained in its position against the action of the spring 7.

The bracket 3 is formed of a single piece of spring wire; two connecting portions 3.3 extend from the circular but circumferentially incomplete ring portion 3.2, being bent at 90° to the plane thereof, and merging in the circular upper engaging ring portion 3.1; the connecting portions 3.3 are bent and angled once more, approximately in the region 3.4 at the middle between the ring portions 3.2 and 3.1.

It is clear that the bracket 3 of the present invention does not have a solder joint, contrary to the prior art. This means that its original springiness and hardness are not influenced by heating for soldering purposes. Material fatigue which may occur has no influence at all upon the triggering of the detonator or upon the triggering forces required. Even after the safety pin 5 is removed, the bracket 3 need not withstand any forces exerted by the spring 7, since these are absorbed by the conical wall bounding the groove 1.1 in the housing 1. An inward pressure on the outer end portion 2.2 of the firing pin, for example as a result of shock waves caused by proximal detonations of mine-clearing charges or the like, cannot trigger the detonator since the ring portion 3.2 prevents a movement of the firing pin 2 inwardly into the housing 1. Even lateral shock waves, resulting from a detonation of mine-clearing charges laterally of the detonator, or for example resulting from the explosion of an adjacent mine, will not cause the detonator to become triggered since the completely open configuration of the externally exposed ring portion 3.1 offers too little resistance to the shock wave that the ring portion 3.1 cannot be tilted to an extent sufficient for the ring portion 3.2 to become disengaged from the channel formed by the cooperating grooves.

The detonator according to the present invention can be triggered only by exerting a lateral pull upon the ring portion 3.1, that is a pull transversely of the elongation of the housing 1. If, for example, the detaonator is used in an anti-personnel mine, then trip-wires will be connected with the ring portion 3.1 and led from there in various different directions to extend laterally of the housing 1. If a pull is exerted in lateral direction by one of this trip wires upon the portion 3.1, for example because someone has stepped upon the wire, the ring portion 3.1 will be bent laterally and the ring portion 3.2 will be pulled out of the grooves 1.1 and 2.3. As this occurs, the ring portion 3.2 will open up since it is circumferentially incomplete and at the same time the outwardly directed lever action will tend to stress the spring 7 still further, namely by the extent of the depth of the groove 1.1. The pull and triggering in lateral direction can come from any lateral direction; depending upon the direction from which the pull comes, the bracket 3 will first turn circumferentially of the pin 2 in the direction in which the pull acts, and only thereafter by pulled out of the groove 1.1. Furthermore, a pull in direction axially upwardly of the housing 1 will also trigger the device.

Another way of effecting the triggering is by placing pressure upon the ring portion 3.1 in downward direction, that is in direction towards the lower end of the housing 1. Seen in side view the configuration of the bracket 3 corresponds in effect to an angled lever, since in the event of a downwardly acting pressure upon the ring 3.1 the area 3.5 will act as a pivot. A shifting of the upper ring portion 3.1 in downward direction through approximately 30° causes the ring portion 3.2 to become displaced upwardly through approximately 30°, and to emerge in part from the groove 1.1, so that the pressure of the spring 7 forces the ring portion 3.2 far enough apart — since it is no longer being held by the walls bounding the groove 1.1— so that it frees the firing pin 2 and the latter can move against the firing cap.

The level of force required to trigger the device according to the present invention depends upon the dimensions of the grooves 1.1 and 2.3 and the force exerted by the firing pin spring 7. Since material fatigue and aging thus has no influence upon the triggering force level, the device according to the present invention assures that it will operate at uniform triggering force levels over long periods of time, that is despite the fact that it may have been stored for long periods of time, or that the device provided with the novel detonator has been in use for a long period of time, for instance a mine which has been installed as part of a mine field.

Making the housing 1 and the firing pin 2 of impact-resistant and temperature-resistant synthetic plastic material, such as Makrolon or Lexan, is particularly advantageous because they can be made by injection molding or in other ways. The housing 1 completely covers the metallic nipple 8 so that the latter need not be provided with a protective lacquer covering.

A particular advantage of the device according to the present invention is the fact that it is lighter by approximately 60% than a smaller device made of metal. This is very important in military devices, as is the fact that no corrosion need be feared even under extreme climatic conditions or over a long period of time.

The nut 4 further aids in making the device of the present invention very safe. It embraces the connecting portions 3.3 and holds the same together, as long as the safety pin 5 is threaded into the threads 4.2 of the nut 4. The latter can be so constructed that after removal of the safety pin 5 it can be pivotable relative to the bracket 3 due to the loose surrounding by the portion 4.1, or else in such a manner that both sides are angled as shown for the left side of the nut in FIG. 3.

After the detonator of the invention is connected with the device to be detonated, and before the trip wires are connected to the portion 3.1, it is possible that the unit composed of the pin 5, the bracket 3, the nut 4 and the pin 2 are not oriented in the desired or necessary direction. If so, the entire unit can readily be turned to the desired direction, during which movement the portion 3.2 will turn in the grooves 1.1 and 2.1.

The device according to the present invention overcomes all of the earler outlined disadvantages of the prior art and is simple and inexpensive to produce, thus offering a combination of advantages which are not attained in any of the prior-art detonators.

It will be understood that each of the elements described above, or two or more together, may also find a useful application in other types of constructions differing from the types described above.

While the invention has been illustrated and described as embodied in a detonator, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A detonator, comprising a housing; a firing cap in said housing; a firing pin movable lengthwise in said housing and having a free end adapted to impact said firing cap; biasing means permanently biasing said firing pin towards said firing cap; and firing-pin retaining means for retaining said firing pin against yielding to the biasing force of said biasing means, comprising a spring-wire clip having a circumferentially incomplete retaining portion received in an annular channel composed to two registering annular grooves formed in an outer circumferential surface of said firing pin and a juxtaposed inner circumferential surface of said housing.

2. A detonator as defined in claim 1, wherein each of said grooves is of substantially conical crosssection.

3. A detonator as defined in claim 1, wherein said housing is provided with a passage which accommodates said firing pin and has an open end, said firing pin having an end portion extending from the interior of said housing through said open end to the exterior; and wherein said grooves are formed in said end portion and at said open end, respectively.

4. A detonator as defined in claim 1, wherein said firing pin is hollow.

5. A detonator as defined in claim 1; further comprising a nipple at one end of said housing and having a transverse dimension smaller than said housing.

6. A detonator as defined in claim 1, said retaining portion of said clip encircling said firing pin, and said groove in said firing pin having in direction normal to the elongation of the firing pin a depth which is at least equal to half the diameter of the wire of said clip.

7. A detonator as defined in claim 6, wherein said clip further comprises a loop portion outside said housing, and two connecting portions connecting said loop portion with said retaining portion.

8. A detonator as defined in claim 7, wherein the planes of said loop portion and of said retaining portion are inclined with reference to one another.

9. A detonator as defined in claim 7, further comprising a holding member holding said connecting portions against transverse movement away from one another.

10. A detonator as defined in claim 7, wherein the plane of said two connecting portions and the plane of said retaining portion are inclined at a right angle with reference to one another.

* * * * *